United States Patent
McAuliffe et al.

(10) Patent No.: US 10,237,657 B2
(45) Date of Patent: Mar. 19, 2019

(54) WIRELESS HEADSET ANTENNAS

(71) Applicant: Apple Inc., Cupertino, CA (US)

(72) Inventors: Erin A. McAuliffe, Campbell, CA (US); Jerzy S. Guterman, Mountain View, CA (US); Mattia Pascolini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 322 days.

(21) Appl. No.: 15/255,801

(22) Filed: Sep. 2, 2016

(65) Prior Publication Data

US 2018/0070179 A1   Mar. 8, 2018

(51) Int. Cl.
*H01Q 1/24* (2006.01)
*H01Q 1/27* (2006.01)
(Continued)

(52) U.S. Cl.
CPC ............. *H04R 5/033* (2013.01); *H01Q 1/243* (2013.01); *H01Q 1/273* (2013.01); *H01Q 1/38* (2013.01);
(Continued)

(58) Field of Classification Search
CPC .... H04R 5/033; H04R 2201/107; H04R 3/12; H05K 1/147; H05K 1/0298; H05K 1/028;
(Continued)

(56) References Cited

U.S. PATENT DOCUMENTS 6,980,165 B2    12/2005   Yuasa et al.
7,358,925 B2     4/2008   Rosenberg et al.
(Continued)

FOREIGN PATENT DOCUMENTS

CN        2422781 Y    3/2001
CN      101384098 A    3/2009
(Continued)

OTHER PUBLICATIONS

Saulsbury et al., U.S. Appl. No. 15/270,445, filed Sep. 20, 2016.
(Continued)

*Primary Examiner* — Sean H Nguyen
(74) *Attorney, Agent, or Firm* — Treyz Law Group, P.C.; G. Victor Treyz; Joseph F. Guihan

(57) ABSTRACT

An accessory such as a wireless headset may have an antenna for transmitting and receiving wireless signals. First and second earbuds may be coupled to different ends of a housing for the accessory. A rigid flex printed circuit board in the housing may include a rigid printed circuit portion. The rigid printed circuit portion may include first and second rigid printed circuit layers. A first portion of a flexible printed circuit may be interposed between the first and second rigid layers. A second portion of the flexible printed circuit may extend from an end of the rigid layers and may be wrapped around the first rigid layer. Planar inverted-F antenna resonating element, antenna shorting, and antenna feeding traces may be formed on the second portion of the flexible printed circuit. The efficiency of the antenna may be undisturbed by the presence of a user's body adjacent to the accessory.

27 Claims, 9 Drawing Sheets

(51) Int. Cl.

| | |
|---|---|
| *H01Q 1/38* | (2006.01) |
| *H01Q 1/44* | (2006.01) |
| *H01Q 1/48* | (2006.01) |
| *H01Q 9/04* | (2006.01) |
| *H01Q 9/42* | (2006.01) |
| *H03H 7/38* | (2006.01) |
| *H04R 3/12* | (2006.01) |
| *H05K 1/02* | (2006.01) |
| *H05K 1/14* | (2006.01) |
| *H05K 1/18* | (2006.01) |
| *H05K 7/14* | (2006.01) |
| *H04R 5/033* | (2006.01) |

(52) U.S. Cl.
CPC ................ *H01Q 1/44* (2013.01); *H01Q 1/48* (2013.01); *H01Q 9/04* (2013.01); *H01Q 9/0421* (2013.01); *H01Q 9/42* (2013.01); *H03H 7/38* (2013.01); *H04R 3/12* (2013.01); *H05K 1/028* (2013.01); *H05K 1/0216* (2013.01); *H05K 1/0298* (2013.01); *H05K 1/147* (2013.01); *H05K 1/181* (2013.01); *H05K 7/1427* (2013.01); *H04R 2201/107* (2013.01); *H05K 2201/055* (2013.01)

(58) Field of Classification Search
CPC .... H05K 1/181; H05K 1/0216; H05K 7/1427; H03H 7/38; H01Q 1/38; H01Q 9/0421; H01Q 1/48; H01Q 1/243; G08B 3/10; H02M 2001/0006
USPC .................................................. 379/167.05
See application file for complete search history.

(56) References Cited

U.S. PATENT DOCUMENTS

| | | | |
|---|---|---|---|
| 8,086,288 | B2 | 12/2011 | Klein |
| 9,293,810 | B2 | 3/2016 | Darden, IV et al. |
| 2011/0133995 | A1* | 6/2011 | Pascolini ................ H01Q 7/00 343/702 |
| 2011/0136447 | A1* | 6/2011 | Pascolini ............... H01Q 1/243 455/90.2 |
| 2012/0231750 | A1* | 9/2012 | Jin ......................... H01Q 1/243 455/77 |
| 2013/0156250 | A1 | 6/2013 | Huang et al. |
| 2014/0187179 | A1 | 7/2014 | Ferguson |
| 2014/0292591 | A1 | 10/2014 | Li et al. |
| 2014/0323183 | A1* | 10/2014 | Klein ..................... H04B 1/385 455/569.1 |
| 2015/0049275 | A1 | 2/2015 | Posner et al. |
| 2015/0212114 | A1 | 7/2015 | Mayo et al. |
| 2016/0050474 | A1 | 2/2016 | Rye et al. |

FOREIGN PATENT DOCUMENTS

| | | |
|---|---|---|
| CN | 204180243 U | 2/2015 |
| CN | 204334908 U | 5/2015 |
| CN | 204993753 U | 1/2016 |
| EP | 1646109 B1 | 10/2008 |

OTHER PUBLICATIONS

McAuliffe et al., U.S. Appl. No. 14/993,548, filed Jan. 12, 2016.
Peterson et al., U.S. Appl. No. 15/206,144, filed Jul. 8, 2016.

* cited by examiner

WIRELESS HEADSET ANTENNAS

BACKGROUND

This relates generally to electronic devices and, more particularly, to electronic devices with wireless circuitry.

Electronic devices such as electronic accessories for cellular telephones, computers, and other electronic equipment often include wireless circuitry. For example, headsets or earbuds are available that communicate wirelessly with cellular telephones and other equipment.

Challenges can arise in implementing wireless communications circuitry in a compact device such as a headset. If care is not taken, antennas will not perform effectively. This can make it difficult or impossible to achieve desired levels of wireless communications performance.

It would therefore be desirable to be able to provide devices such as headsets with improved wireless circuitry.

SUMMARY

An accessory such as a wireless headset may have an antenna for transmitting and receiving wireless signals. The accessory may have a housing with a main body portion. A first speaker or earbud may be coupled to a first end of the main body portion. A second speaker or earbud may be coupled to an opposing second end of the main body portion. A battery may be formed at the first and a rigid flex printed circuit board may be formed at the second end of the main body portion.

The rigid flex printed circuit board may include a rigid printed circuit portion. The rigid printed circuit portion may include first and second rigid printed circuit layers. A first portion of a flexible printed circuit may be interposed between the first and second rigid printed circuit layers. A second portion of the flexible printed circuit may extend from an end of the first and second rigid printed circuit layers. The second portion of the flexible printed circuit may be free from the first and second rigid printed circuit layers. The second portion of the flexible printed circuit may be folded or wrapped around the first rigid printed circuit layer. A distal end of the second portion of the flexible printed circuit may be interposed between an outward-facing surface of the housing and the first rigid printed circuit layer. The second rigid printed circuit layer may be interposed between an inward-facing surface of the housing and the first portion of the flexible printed circuit.

A planar inverted-F antenna may be formed on the rigid flex printed circuit. The planar inverted-F antenna may have a planar antenna resonating element trace, an antenna ground, a shorting trace coupled between the planar antenna resonating element trace and the antenna ground, an a feed arm trace coupled to the planar antenna resonating element trace. The feed arm trace, the shorting trace, and the planar antenna resonating element trace may be formed on the folded portion of the flexible printed circuit. During operation of the accessory, a given edge of the housing may be closer to a user's skin than the other edges of the housing (e.g., an edge of the housing that faces upward during use of the accessory). The shorting trace may be interposed between the given edge of the housing and the feed arm trace on the flexible printed circuit. When configured in this way, the planar inverted-F antenna may be provided with an optimal antenna efficiency that is not significantly impacted by the presence of the user's body during operation of the accessory.

A radio-frequency transceiver and control circuitry may be formed on the rigid printed circuit portion of the rigid flex printed circuit board. The radio-frequency transceiver may receive audio signals or other wireless signals from external equipment such as a cellular telephone over the planar inverted-F antenna. The control circuitry may convey the audio signals to the first and second speakers.

DETAILED DESCRIPTION

Figure 1:
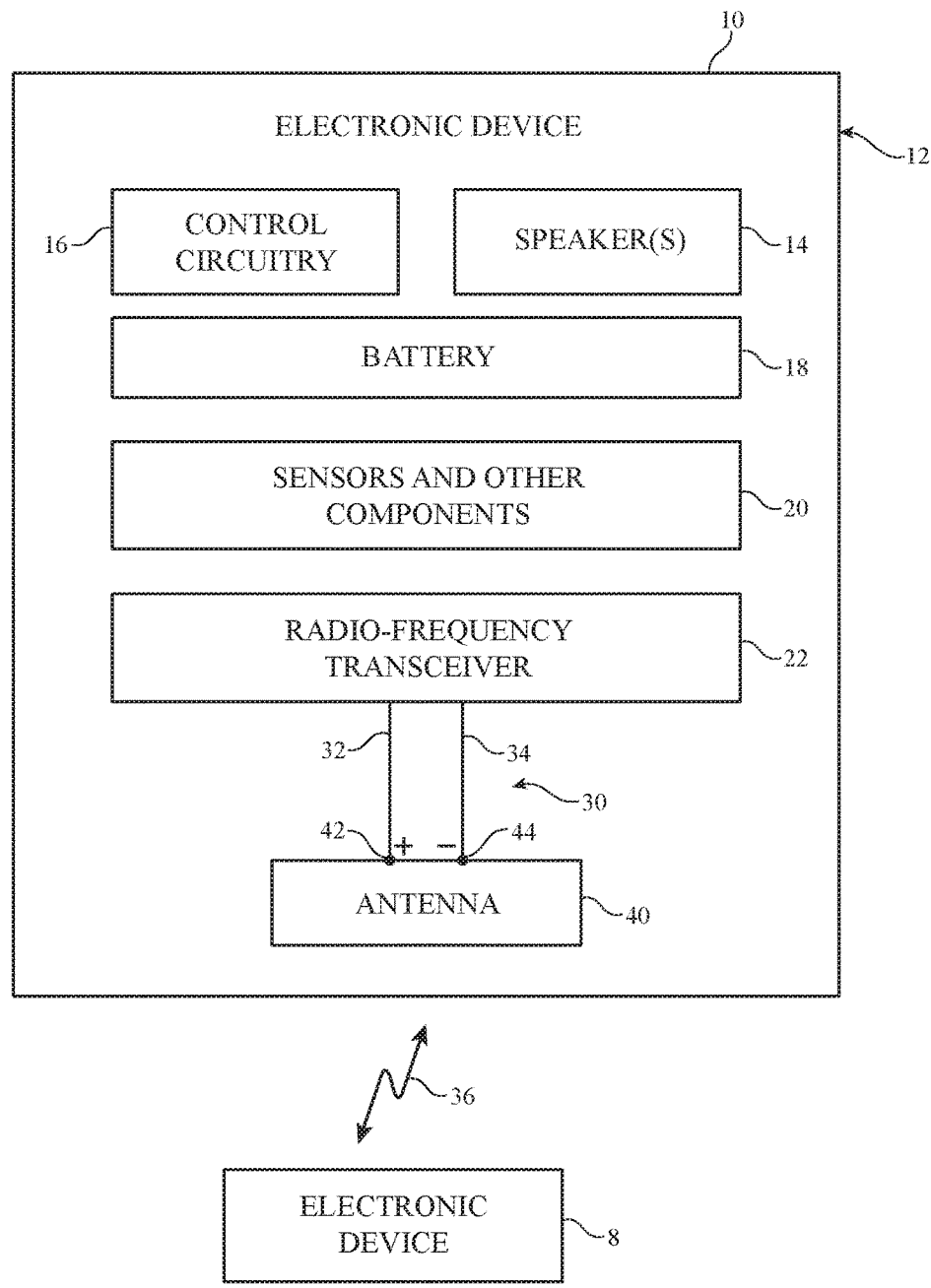
FIG. 1 is a schematic diagram of an illustrative electronic device with wireless circuitry in accordance with an embodiment.

An electronic device of the type that may be provided with wireless circuitry is shown in FIG. 1. Device 10 of FIG. 1 may be a wireless accessory such as a wireless headset, wireless headphones, wireless earbuds, or other small portable accessory of the type that is used in conjunction with another electronic device 8. Electronic device 8 may be a cellular telephone, portable computer, watch, media player, or other host equipment. If desired, device 10 may be a different type of electronic equipment. Configurations in which device 10 is a wireless accessory may sometimes be described herein as an example.

Devices such as device 10 may communicate wirelessly with external electronic equipment such as device 8 over wireless communications link 36. Wireless communications link 36 may be a cellular telephone link (e.g., a wireless link at frequencies of 700 MHz to 2700 MHz or other suitable cellular telephone frequencies), may be a wireless local area network link operating at 2.4 GHz, 5 GHz, or other suitable wireless local area network frequencies, may be a Bluetooth® link operating at 2.4 GHz, may involve millimeter wave communications, may involve near-field communications, or may involve wireless communications in other communications bands. Configurations in which device 10 operates at 2.4 GHz to support short-range communications such as Bluetooth® communications may sometimes be described herein as an example.

As shown in FIG. 1, device 10 (e.g., a headset or other accessory) may include control circuitry such as storage and processing circuitry 16. Storage and processing circuitry 16 may include storage such as nonvolatile memory (e.g., flash memory or other electrically-programmable-read-only memory configured to form a solid state drive), volatile memory (e.g., static or dynamic random-access-memory), etc. Processing circuitry in storage and processing circuitry 16 may be used to control the operation of device 10. This processing circuitry may be based on one or more microprocessors, microcontrollers, digital signal processors, baseband processor integrated circuits, application specific integrated circuits, etc.

Storage and processing circuitry 16 may be used to run software on device 10. The software may handle communications, may process sensor signals and take appropriate action based on the processed sensor signals (e.g., to turn on or off functions in device 10, to start or stop audio playback, etc.), and may handle other device operations. To support interactions with external equipment 8, storage and processing circuitry 16 may be used in implementing communications protocols. Communications protocols that may be implemented using storage and processing circuitry 16 include wireless local area network protocols (e.g., IEEE 802.11 protocols—sometimes referred to as WiFi® and WiGig), protocols for other short-range wireless communications links such as the Bluetooth® protocol, cellular telephone protocols, etc.

Device 10 may include microphones, speakers, tone generators, and other audio components (see, e.g., one or more speakers 14). Microphones may gather voice signals and/or ambient noise signals for noise cancellation functions. Speakers may play back sound for a user. Speakers 14 may, if desired, be located within one or more earbuds associated with device 10. For example, speakers 14 may be formed in a left earbud that is configured to be placed within the left ear of a user and a right earbud that is configured to be placed within the right ear of the user. Tone generators and other sound output devices may generate other audible or non-audible outputs. Sensors and other components 20 in device 10 may include proximity sensors (e.g., capacitive proximity sensors, light-based proximity sensors, etc.), force sensors, buttons, magnetic sensors, accelerometers and other components for measuring device orientation and/or motion, strain gauge sensors, vibrators, connector components, printed circuit board structures, wiring structures, etc.

Device 10 may include battery 18 to provide power to the circuitry of device 10. Battery 18 may be, for example, a rechargeable battery. Battery 18 may be recharged wirelessly (e.g., by providing device 10 with wireless power) or may be recharged via a wired connection between external equipment and device 10. Configurations in which battery 18 is not rechargeable (e.g., in which battery 18 is a replaceable non-rechargeable battery) may also be used. Components 20 may include, if desired, a connector that is configured to receive a cable or other structure that, when connected to the connector, provide power to device 10 for charging battery 18.

Electronic device 10 may include wireless circuitry for supporting wireless communications with external equipment. The wireless circuitry may include radio-frequency transceiver 22 and one or more antennas such as antenna 40.

Antenna 40 may have a feed that includes positive antenna feed terminal 42 and ground antenna feed terminal 44. Transmission line 30 may be used to couple radio-frequency transceiver circuitry 22 to antenna 40. Transmission line 30 may have a positive signal path such as line 32 and a ground signal path such as line 34. Transmission lines in device 10 such as transmission line 30 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within the transmission lines, if desired.

Circuitry 22 may include any desired circuitry associated with the transmission and reception of radio-frequency signals using antenna 40. For example, circuitry 22 may include baseband processor circuitry, amplifier circuitry (e.g., low noise and/or power amplifier circuitry), mixing circuitry such as up-converter and/or down-converter circuitry, converter circuitry such as analog-to-digital converter circuitry and/or digital-to-analog converter circuitry, etc.

Antenna 40 may be formed using any suitable antenna type. For example, antenna 40 may be an antenna with a resonating element that is formed from a loop antenna structure, a patch antenna structure, an inverted-F antenna structure, a slot antenna structure, a planar inverted-F antenna structure, a helical antenna structure, a monopole, a dipole, hybrids of these designs, etc. If desired, antenna 40 may include tunable circuitry and control circuitry 16 may be used to select an optimum setting for the tunable circuitry to tune antenna 40. Antenna adjustments may be made to tune antenna 40 to perform communications in a desired frequency range or to otherwise optimize antenna performance. Antenna 40 may also be implemented using a fixed (non-tunable) configuration if desired.

The components of device 10 may be housed within device housing 12, which may sometimes be referred to as an enclosure or case. Housing 12 may, for example, be formed from of plastic, glass, ceramics, fiber composites, metal (e.g., stainless steel or aluminum), other dielectrics such as silicone or rubber, or a combination of any two or more of these materials. If desired, housing 12 may include an internal frame structure that is enclosed within other housing structures such as a silicone or rubber outer casing. Housing 12 may, if desired, include earbud housing structures that enclose speakers 14 but that are otherwise separated from other portions of housing 12. For example, portions of housing 12 may include holes or other openings that align with speakers 14 to allow sound to be conveyed to or from speakers 14.

Figure 2:
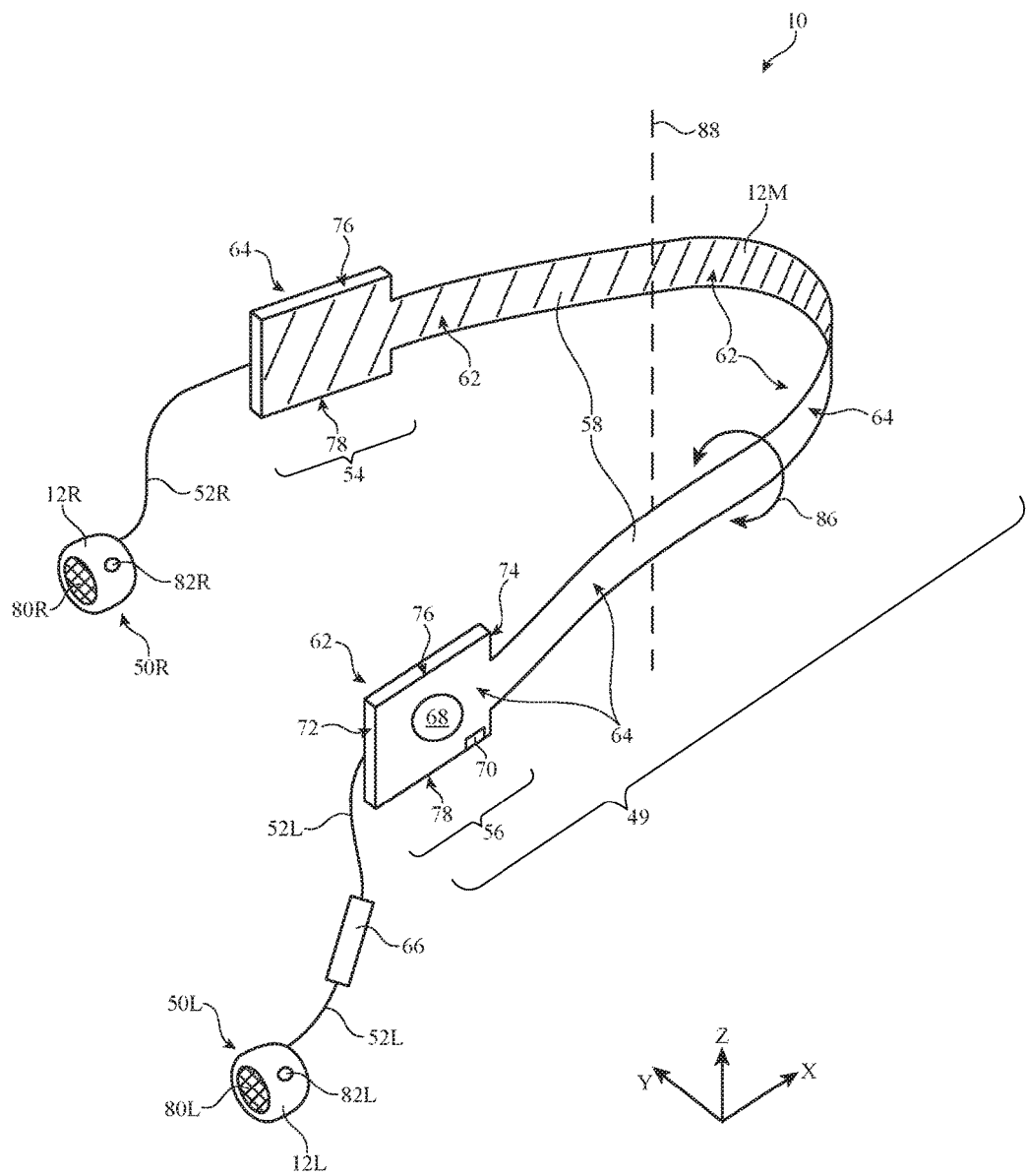
FIG. 2 is a perspective view of an illustrative electronic device such as a wireless headset in accordance with an embodiment.

FIG. 2 is a perspective view of electronic device 10. In the illustrative configuration of FIG. 2, device 10 is a portable wireless accessory such as a wireless headset (e.g., a wireless pair of headphones). Other configurations may be used for device 10 if desired. The example of FIG. 2 is merely illustrative.

As shown in FIG. 2, device 10 may include a main device body 49. Main device body 49 may be enclosed within a main body housing portion 12M of housing 12. Device 10 may include earbuds such as right earbud 50R and left earbud 50L. Right earbud 50R may be enclosed within a portion 12R of housing 12 whereas left earbud 50L is enclosed with a portion 12L of housing 12. Right earbud 50R may be coupled to main body portion 49 of device 10 by conductive line 52R. Left earbud 50L may be coupled to main body portion 49 by conductive line 52L. Conductive lines 52 may be covered using a portion of housing 12 (e.g., rubber wire coverings or other structures). Conductive lines 52 may convey audio signals from circuitry within main body 49 to earbuds 50 and/or may convey microphone signals to main body 49.

The example shown in FIG. 2 in which earbud housing portions 12R and 12L are separate from main housing body 12M is merely illustrative. If desired, housing 12 may include a continuous housing structure that extends from main body portion 12M to earbuds 50 (e.g., conductive lines 52R and 52L may be enclosed within housing 12 or may be formed using conductive wire that is separate from housing 12).

Main body 49 may include a first body portion 54 formed at a first end of housing 12M and a second body portion 56 formed at an opposing second end of housing 12M. Body portion 54 may be coupled to body portion 56 by band 58. Band 58 may be flexible or semi-rigid and may have a curved shape to accommodate a user's head or neck. For example, when operating device 10, the user's head or neck may be located at axis 88. Band 58 may curve around axis 88 so that device 10 remains in place on the user during use. Band 58 may, if desired, include rigid or semi-rigid shape retention structures that allow band 58 to maintain a curved shape (e.g., even when device 10 is not being worn by a user).

If desired, battery 18 (FIG. 1) may be located within portion 54 of main device body 49. Portion 54 may therefore sometimes be referred to herein as battery portion 54, battery region 54, battery case 54, battery body 54, or battery box 54. Circuitry such as control circuitry 16, transceiver circuitry 22, transmission line 30, and antenna 40 may be located within portion 56 of main device body 49. For example, control circuitry 16, transceiver circuitry 22, transmission line 30, and antenna 40 may be formed on a substrate such as a main logic board that is located within housing 12M at body portion 56. The main logic board may include rigid printed circuit board structures, flexible printed circuit board structures, a combination of rigid and flexible printed circuit board structures (e.g., so-called "rigid-flex" circuit board structures), integrated circuit structures, or any other desired structures. Portion 56 of main body 49 may therefore sometimes be referred to herein as main logic board portion 56, control portion 56, main logic board region 56, main logic board box 56, control body 56, control region 56, or main logic board body 56.

Control portion 56 of device 10 may include connector structures such as connector 70. Connector 70 may be configured to receive a cable or other structure that is used to provide power or other signals to device 10. In one suitable arrangement, connector 70 is located at lower edge 78 of body portion 56. If desired, connector 70 may be located at upper edge 76, right edge 74, or left edge 72 of body portion 56, or elsewhere on device 10. In scenarios where battery 18 is formed at region 54, power lines may be run through band 58 to provide power for charging battery 18 at region 54. Once charged, battery 18 may convey power to components within main logic region 56 over the power lines within band 58.

Upper edge 76 may extend across the entire length of main housing body 49. For example, upper edge 76 may extend across control portion 56 from edge 72 to edge 74, across the length of band 58, and across the length of battery portion 76. Similarly, lower edge 78 may extend across the entire length of main housing body 49. For example, lower edge 78 may extend across control portion 56, across the length of band 58, and across the length of battery portion 76. The height of control portion 56 and/or battery portion 54 (e.g., the length of side 72) may, if desired, be greater than the height of band 58. A first face (side or surface) 64 of body 49 may extend continuously across the entire length of body 49. Similarly, a second opposing face 62 of body 49 may continuously extend across the entire length of body 49.

Antenna 40 may be located within main logic board region 56 of body 49. Antenna 40 may receive radio-frequency signals from external device 8. Control circuitry 16 may be located within main logic board region 56 and may extract audio signals from the radio-frequency signals received over antenna 40. Control circuitry 16 may convey the audio signals to left earbud 50L over line 52L. Band 58 may include conductive audio lines that carry the audio signals to right earbud 50R (e.g., over line 52R).

Right earbud 50R may have an area such as area 80R and left earbud 50L may have an area such as area 80L through which sound may be emitted from speakers 14. Area 80R may be formed from an opening in housing portion 12R whereas area 80L may be formed from an opening in housing portion 12L. Openings 80 may be provided with mesh structures or other protective structures that protect speakers 14 within housing portions 12R and 12L.

If desired, an input device such as communications box 66 may be interposed on left conductive line 52L. Communications box 66 may include one or more buttons that accept input from the user of device 10. For example, communications box 66 may include volume adjustment buttons or sliders, playback control buttons, or other input components.

If desired, communications box 66 may include a microphone that generates audio signals in response to mechanical sound (e.g., voice signals or other sound signals generated in response to the voice of the user or other ambient sounds). The audio signals generated at communications box 66 may be conveyed to control circuitry in main logic region 56 over conductive line 52L. Radio-frequency transceiver 22 may generate radio-frequency signals based on the audio signals and may transmit the signals to external device 8 using antenna 40. This example is merely illustrative. If desired, communications box 66 may be omitted.

Antennas such as antenna 40 may be affected by the presence of nearby objects. For example, antenna 40 may exhibit an expected antenna efficiency when operated in free space in the absence of nearby external objects, but may exhibit a different antenna efficiency when operated in the presence of external objects. When operating device 10 (e.g., when listening to audio using device 10), a user typically wears device 10 on their person. For example, the user may wear device 10 so that band 58 wraps around their head or neck. Wearing device 10 may bring the user's body (e.g., the skin of a user's neck or head), clothes, or other external objects within the vicinity of antenna 40. If care is not taken, antenna 40 may exhibit a deteriorated antenna efficiency when device 10 is worn on the body of a user (e.g., the efficiency of the antenna may decrease because the impedance of the antenna has been changed due to loading from the user's body).

Antenna 40 and other components within device 10 may be configured so that the impact of the user's body on antenna 40 during operation of device 10 is minimized. For example, antenna 40 and other components in device 10 may be configured so that antenna 40 is located as far away from the user's body as possible when device 10 is being worn by the user. Device 10 may include structures that help to ensure that device 10 maintains an optimal orientation with respect to the user's body and an optimal antenna efficiency during use (e.g., an orientation that allows the user's body to have as little of an effect on the efficiency of antenna 40 as possible).

The optimal orientation may, for example, be an orientation at which edge 76 of body 49 is facing upwards (e.g., towards the head of the user) and at which edge 78 is facing downward (e.g., towards the torso of the user). In the optimal orientation, the face 64 of device body 49 (e.g., side or wall 64 of housing 12M) faces outwards (e.g., away from the user's body or neck) whereas face 62 faces inwards (e.g., towards the user's body or neck). Face 64 may therefore sometimes be referred to herein as outer face 64, outer wall 64, or outer side 64 and face 62 may sometimes be referred to herein as inner face 62, inner wall 62, or inner side 62.

In order to help maintain the optimal orientation, band 58 may include one or more bend retention structures. The bend retention structures may include rigid metal structures such as a length of rigid wire or other rigid or semi-rigid structures. The bend retention structures may allow band 58 to maintain curve around axis 88 (e.g., to conform to the body of the user) while also preventing torsion or twisting of band 58 (e.g., in the direction as shown by arrow 86). By preventing twisting of band 58, the bend retention structures may help to ensure that edge 76 of housing body 49 faces upwards, edge 78 faces downwards, face 62 faces inwards, and face 64 faces outwards when device 10 is being used. Maintaining the curved shape of housing portion 12M around axis 88 may, for example, encourage or require the user to place device 10 around their neck or head in the optimal orientation when beginning use of device 10.

Other structures may be used to ensure that device 10 is at an optimal orientation when being worn by the user. If desired, a graphic component such as element 68 may be located on outer side 64 of device body 49 (e.g., at control region 56, at battery region 54, or elsewhere on body 49). Graphic component 68 may be, for example, a logo, artistic design, or other structures to be viewed by the user or others. If desired, graphic component 68 may include light-emitting components or display structures (e.g., that convey visual content to the user or others). As graphic component 68 provides visual information to the user or others, forming graphic component 68 on outer side 64 of device body 49 may encourage or effectively require the user to wear device 10 in the optimal orientation during use (e.g., in order to properly view visual element 68, the user may need to wear device 10 in the optimal orientation).

Right earbud 50R may be configured to provide audio to the right ear of the user and left earbud 50L may be configured to provide audio to the left ear of the user during operation. For example, right earbud 50R may play audio signals from the right channel of a stereo audio feed through speaker port 80R whereas left earbud 50L plays audio signals from the left channel of the stereo audio feed through speaker port 80L. Housing 12R of right earbud 50R may have a shape or configuration that allows earbud 50R to fit within the right ear of the user whereas housing 12L has a shape or configuration that allows earbud 50L to fit within the left ear of the user. Housing 12L may be unwearable or uncomfortable to wear in the user's right ear and housing 12R may be unwearable or uncomfortable to wear in the user's left ear, for example. If desired, left earbud 50L may include a label 82L that identifies left earbud 50L as the earbud for use in the user's left ear, whereas right earbud 50R includes a label 82R that identifies right earbud 50R as the earbud for use in the user's right ear. Configuring earbuds 50 in this manner may encourage or require the user to wear device 10 at an optimal orientation for antenna 40.

The example of FIG. 2 in which device 10 includes earbuds 50 is merely illustrative. In general, earbuds 52 may be replaced with any other desired structures for housing speakers 14. For example, earbuds 52 may be replaced by over-the-ear structures such as ear cups or cans, if desired.

Figure 3:
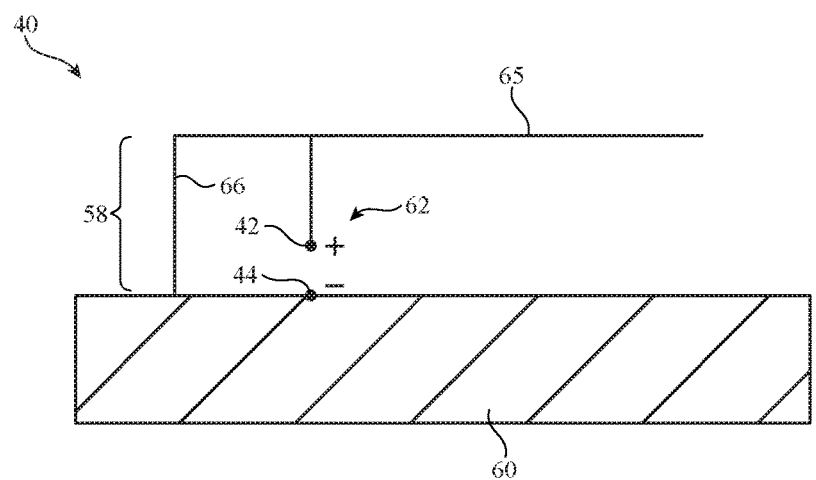
FIG. 3 is a schematic diagram of an illustrative antenna of the type that may be used in an electronic device in accordance with an embodiment.

FIG. 3 is a schematic diagram of antenna 40 within main logic board region 56 of device 10. In the example of FIG. 3, antenna 40 is an inverted-F antenna and has inverted-F antenna resonating element 58 and antenna ground 60. Antenna 40 may be fed by coupling transmission line 30 (FIG. 1) to antenna feed arm 62 and ground 60. Antenna feed arm 62 may be coupled to resonating element arm 65. Positive (signal) antenna feed terminal 42 may be coupled to antenna feed arm 62. Ground antenna feed terminal 44 may be coupled to ground 60. Return path 66 (i.e., a short circuit path) may be coupled between antenna resonating element arm 65 and ground 60 in parallel with feed 62. The resonant frequency of antenna 40 may, for example, be determined by the length of resonating element arm 65.

Antenna ground 60 may be formed from ground traces in a printed circuit or other substrate, metal portions of a battery, metal housing structures, metal portions of internal device components, other conductive ground structures, or a combination of these structures in device 10. Antenna resonating element 58 may be formed from metal printed circuit traces and/or other conductive structures in device 10.

If desired, antenna 40 may be a planar inverted-F antenna. When configured as a planar inverted-F antenna, resonating element arm 65 may be formed using a conductive structure that extend across a planar lateral area above ground 60 (e.g., a conductive sheet, a conductive trace, conductive foil, etc. that is separated from ground 60 by a predetermined distance). The perimeter of the conductive structure forming resonating element arm 65 may help to define the resonant frequency of antenna 40, for example.

Figure 4:
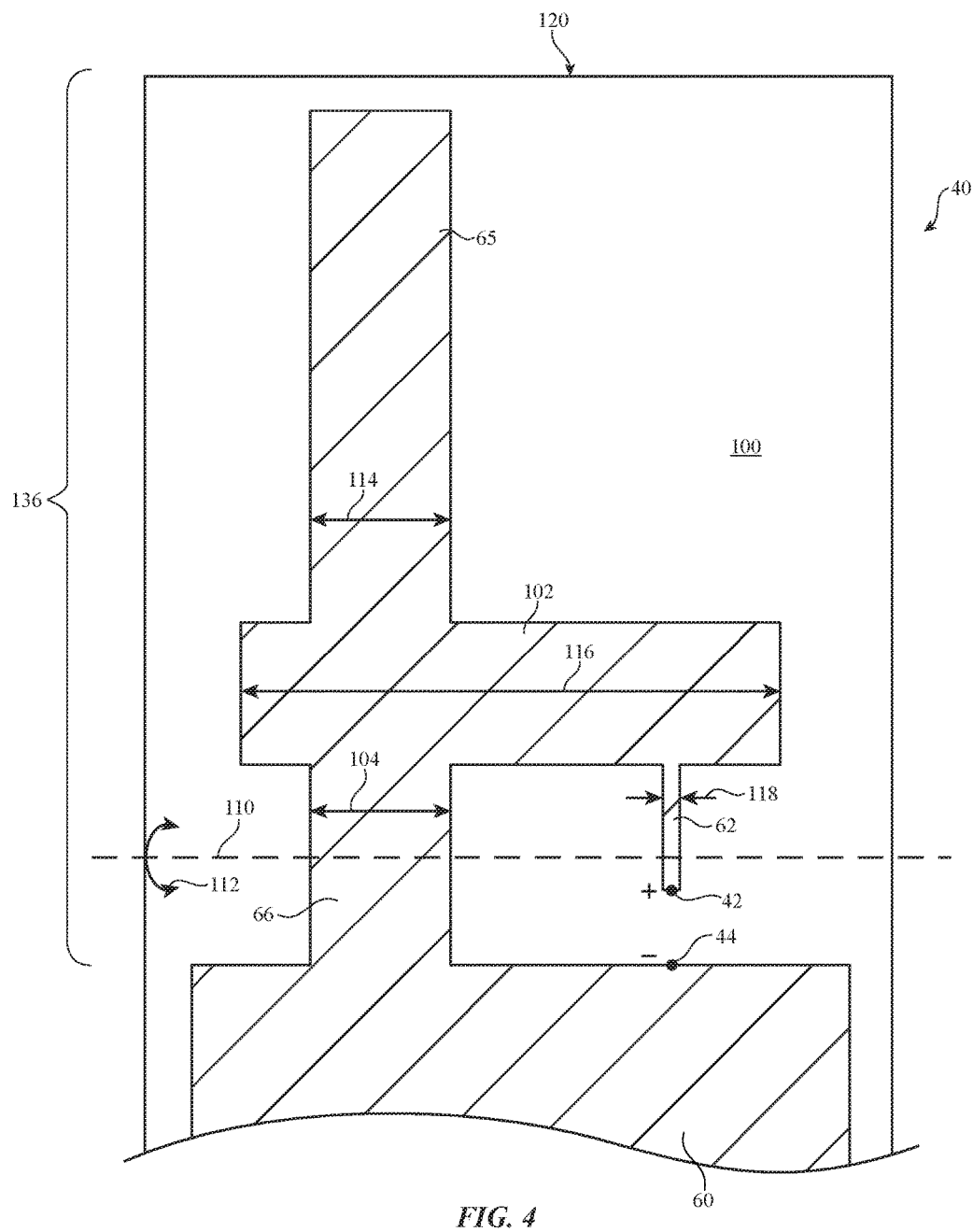
FIG. 4 is a top-down view of an illustrative antenna of the type that may be used in an electronic device in accordance with an embodiment.

FIG. 4 is a top-down diagram showing how antenna 40 may be implemented using planar inverted-F antenna structures formed from conductive structures on a dielectric substrate. As shown in FIG. 4, resonating element arm 65, feed arm 62, short circuit arm 66, and ground plane 60 may be formed using conductive structures such as conductive traces on a dielectric substrate 100.

Dielectric substrate 100 may be a flexible printed circuit (e.g., a printed circuit formed from a flexible polymer substrate such as a layer of polyimide or a sheet of other flexible polymer material) such as a flexible printed circuit board. The conductive traces of antenna 40 may be formed (e.g., patterned) on a surface of flexible printed circuit board 100 or on an internal layer of flexible printed circuit board 100.

Flexible printed circuit board 100 may be folded, bent, or wrapped around axis 110 as shown by arrow 112. As shown in the example of FIG. 4, flexible printed circuit board 100 has been unfolded and placed flat. When placed within portion 56 of device 10, flexible printed circuit board 100 may be folded around axis 110. This may allow antenna 40 to occupy less volume within device 10 than in scenarios where board 100 is laid flat. Bend 112 may allow antenna resonating element arm 65 to be placed within a plane that is at a predetermined distance with respect to antenna ground 60. Bend 112 around axis 110 may be, for example, a 180 degree bend as an example. In general, bend 112 may be any angle greater than 90 degrees and less than or equal to 180 degrees.

In one suitable arrangement, the portion of flexible printed circuit board 100 that extends from ground plane 60 may sometimes be referred to herein as flexible tail portion 136. In this scenario, the portion of flexible printed circuit board 60 may be held in a rigid configuration (e.g., by rigid structures above and/or below flexible printed circuit board 100) whereas tail region 136 remains in a flexible configuration (e.g., thereby allowing tail 136 to flex or bend such as around axis 110). Tail portion 136 at distal end 120 may be substantially parallel to ground 60 when substrate 100 is bent around axis 110.

In the example of FIG. 4, short circuit arm 66 and feed arm 62 are bent around axis 110 (e.g., axis 110 overlaps antenna 40 at arms 66 and 62). Bending flexible printed circuit board 100 in this manner may allow antenna resonating element arm 65 to be oriented in a desired direction (e.g., in a direction such that antenna resonating element arm 65 is not affected by the user's body while operating device 10) while still being parallel to and separated from ground 60 by a predetermined distance. This is example merely illustrative. In general, axis 110 may overlap any desired portion of the antenna traces formed on circuit board 100.

Short circuit arm 66 may have a width 104 whereas resonating element arm 65 has a width 114. Resonating element arm trace 65 may be coupled to short circuit arm 66 and feed arm 62 by matching trace 102 (e.g., resonating element arm 65 may extend from matching trace 102 towards distal end 120 of flexible printed circuit 100). Matching trace 102 may have a width 116. Feed arm 62 may have a width 118. Width 114 may be the same as or may be different from width 116. Width 114 may be the same as or may be different from width 104. Width 116 may be the same as or may be different from width 104. Width 118 may be the same as or may be different from widths 114, 116, and/or 104. In one suitable arrangement, width 114 is greater than width 104, width 104 is greater than width 118, and width 116 is greater than width 114.

If desired, the ratio of width 114 to width 116 may be configured to provide a desired impedance match for antenna resonating element arm 114. The ratio of width 114 to width 116 may, if desired, be selected to tune the performance of antenna 40. Additional matching circuitry (e.g., a network of resistive, capacitive, inductive, and/or switching components) may be interposed on transmission line path 32 between feed terminal 42 and transceiver 22 (e.g., to provide a desired impedance match between antenna 40 and transmission line 30).

The example of FIG. 4 is merely illustrative. If desired, antenna resonating element arm 65 may have any desired shape. For example, arm 65 may have a bent or winding shape, may include multiple branches, may include straight and/or curved edges, may have edges that extend at non-perpendicular angles with respect to each other, or may have any other desired shape. In general, antenna resonating element 65 may be provided with a desired shape and perimeter so that antenna 40 operates at a desired resonant frequency. Similarly, conductive traces 102, 60, 66, and 62 may have any desired shape and may include straight, curved, or bent edges oriented at any desired angles. Ground plane 60 may be formed from a layer of conductive material on printed circuit board 100 and/or from other conductive components in control portion 56 of device body 49.

Figure 5:
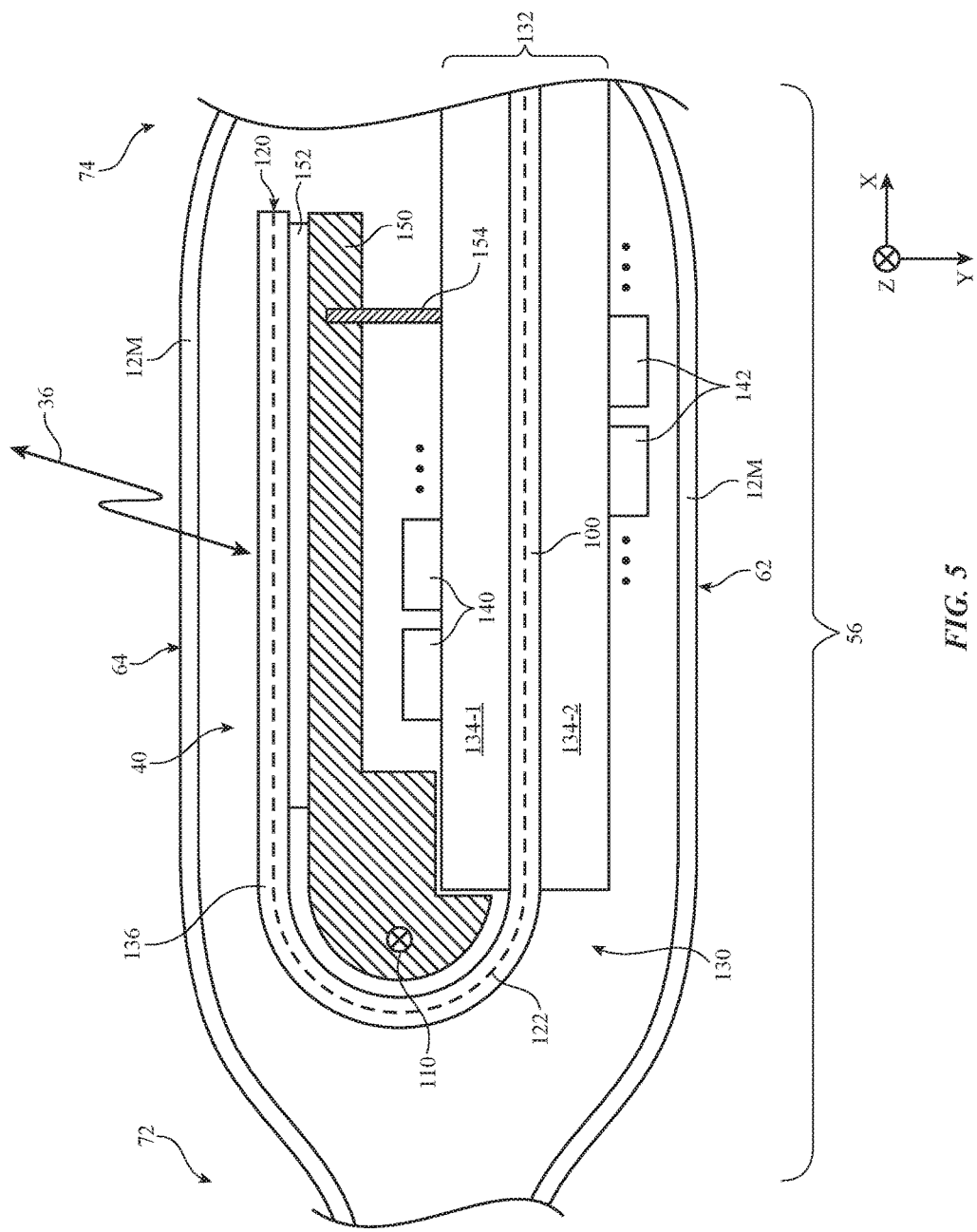
FIG. 5 is a cross-sectional side view showing how an illustrative antenna may be wrapped around a substrate for placement within an electronic device in accordance with an embodiment.

FIG. 5 is a cross-sectional side view showing how flexible printed circuit board 100 may be bent around axis 110 and placed within main logic region 56 of device body 49. In particular, FIG. 5 shows a cross-sectional view of main logic region 56 of device body 49, where the plane of the page is defined by the x-y axes of the perspective view shown in FIG. 2 (e.g., a view as taken in the direction of arrow 78 of FIG. 2).

As shown in FIG. 5, printed circuit 130 may be formed within housing 12M at control region 56 of device body 49. Printed circuit 130 may be, for example, the main logic board or motherboard for device 10. If desired, printed circuit 130 may be implemented using "rigid flex" printed circuit material. In a "rigid flex" printed circuit, part of the printed circuit has rigid printed circuit board layers and at least one flexible printed circuit layer whereas another part of the printed circuit has only the flexible printed circuit layers. In the example of FIG. 5, portion 132 of printed circuit 130 has rigid printed circuit board layers 134 (e.g., at least a first rigid layer 134-1 and a second rigid layer 134-2) and at least one flexible printed circuit layer formed using flexible printed circuit 100, whereas another part of printed circuit 130 has only flexible printed circuit layers formed by flexible printed circuit 100 (e.g., tail portion 136 of flexible printed circuit 100 is free from rigid layers such as layers 134). Portion 132 of printed circuit 130 may sometimes be referred to herein as rigid portion 132 (e.g., because rigid layers 134-1 and 134-2 prevent bending of portion 132). Flexible printed circuit 100 may be interposed between first and second rigid layers 134-1 and 134-2 in main logic board 130. Rigid layers 134 may be formed from a material such as fiberglass-filled epoxy or other rigid materials. Metal layers within or on rigid layers 134 may be used to form a portion of antenna ground 60 for antenna 40 if desired. Conductive through-vias or other vertical interconnects may be used to convey signals between layer 134-1, 100, and 134-2 in board 130.

Conductive traces 122 may be formed in or on flexible printed circuit 100. Conductive traces 122 may be used to form resonating element arm 65, matching trace 102, shorting trace 66, feed arm trace 62, and/or ground plane 60 of FIG. 4. Other components may be mounted on or in tail portion 136 of the flexible printed circuit 100 in rigid-flex printed circuit 130 if desired.

Components such as components 140 may be mounted on rigid layer 134-1. Components such as components 142 may be mounted on rigid layer 134-2. Components 140 and 142 may include, for example, components used in forming control circuitry 16, components 20, and transceiver circuitry 22 of FIG. 1 and/or any other desired circuitry.

When main logic board 130 is placed within portion 56 of device body 49, rigid printed circuit layer 134-2 may be interposed between flexible printed circuit 100 and inner side 62 of housing 12M. The planar surfaces of rigid printed circuit layers 134 may extend from first side 72 of main logic region 56 (e.g., the side of device body 49 from which left earbud conductor 52L extends) to second side 74 of main logic region 56 (e.g., the side of main logic portion 56 that is connected to band 58). When device 10 is being worn by a user (e.g., in the optimal orientation), inner side 62 may face the body (e.g., neck or head) of the user.

Metal structures (e.g., ground plane structures) in or on rigid layers 134-1 and 134-2 and/or components 140 may serve as electromagnetic shielding structures that help to block the electromagnetic influence of external objects adjacent to inner side 62 of housing 12M and antenna 40. If desired, additional electromagnetic shielding structures (e.g., one or more sheets of metal) may be provided to enhance electromagnetic isolation of antenna 40 from external objects adjacent to inner side 62.

As shown in FIG. 5, tail portion 136 of flexible printed circuit 100 may extend from the end of rigid portion 132 of main logic board 130 towards side 72 of device portion 56 and around axis 110. Flexible tail portion 136 may further extend over rigid printed circuit layer 134-1 so that distal end 120 of tail 136 extends from side 72 towards side 74 of device portion 56. When configured in this way, distal end 120 of flexible printed circuit 100 and antenna resonating element arm 65 are interposed between rigid printed circuit layer 134-1 and outer side 64 of housing 12M. Flexible tail 136 may include a first portion that extends parallel to rigid layer 134-1 and a second portion that extends substantially perpendicular to the first portion and rigid layer 134-1 between the first portion and rigid layer 134-1 (e.g., at the bend in the flexible tail). Distal end 120 of flexible printed circuit 100 may extend substantially parallel to rigid printed circuit layer 134, for example. This may serve to orient antenna resonating element arm 65 away from the user's body while the user is operating device 10 with the optimal orientation. In addition, this may serve to separate antenna resonating element arm 65 from the top surface of rigid layer 134-1 or antenna ground 60 by a predetermined distance. The predetermined distance may be, for example, a distance that is less than 1.8 mm and greater than 0.8 mm or any other desired distance. Antenna resonating element arm 65 may transmit radio-frequency signals to external device 8 and may receive radio-frequency signals from external device 8 through outer side 64 of housing 12M. Radio-frequency signals transmitted from antenna resonating element arm 65 towards inner side 62 may be blocked or reflected by ground plane 60 or other metal structures within main logic board 130.

One or more dielectric support structures such as dielectric support structure 150 may be interposed between flexible tail 136 and rigid printed circuit layer 134-1. Dielectric support structure 150 may be, for example, a plastic support structure, ceramic support structure, or other dielectric structure. Dielectric support structure 150 may provide mechanical support to flexible printed circuit tail 136 while the flexible printed circuit is bent around axis 110 (e.g., flexible printed circuit tail 136 may be wrapped around an edge of support structure 150). If desired, distal end 120 of flexible printed circuit 100 may be attached to plastic support structure 150 using an adhesive such as adhesive layer 152. Adhesive layer 152 may include pressure sensitive adhesive, thermally activated adhesive, light cured adhesive, or any other desired adhesive. Adhering flexible printed circuit tail 136 to plastic support structure 150 may help flexible printed circuit 100 to maintain a bent configuration around axis 110.

This example is merely illustrative. If desired, other attachment mechanisms may be used to secure distal end 120 to plastic support 150. For example, screws, fastener structures, pin structures, clip structures, biasing structures that bias distal end 120 towards support 150, or any other desired attachment mechanisms may be used. If desired, alignment structures such as structures 154 may be used to secure plastic support structure 150 in place over rigid circuit 134. Alignment structures 154 may include pin structures, alignment posts, adhesive, or any other desired structures. If desired, alignment structures 154 may also be used to secure distal end 120 of flexible tail 136 in place. For example, alignment structures 154 may be alignment posts that extend through notches in plastic support 150 and/or flexible circuit 100 to hold end 120 in place.

Wrapping flexible printed circuit 100 in this way (e.g., so that antenna resonating element arm 65 is interposed between rigid printed circuit layer 134-1 and outer housing wall 64) may allow antenna 40 to occupy a minimal amount of space within device body portion 56 while also minimizing the impact of the user's body on the efficiency of antenna 40. Placement of device 10 on the user's body in the optimal orientation during use (e.g., with inner side 62 facing the user's body and outer side 64 facing away from the user's body) may further mitigate impacts of the user's body on the efficiency of antenna 40.

Figure 6:
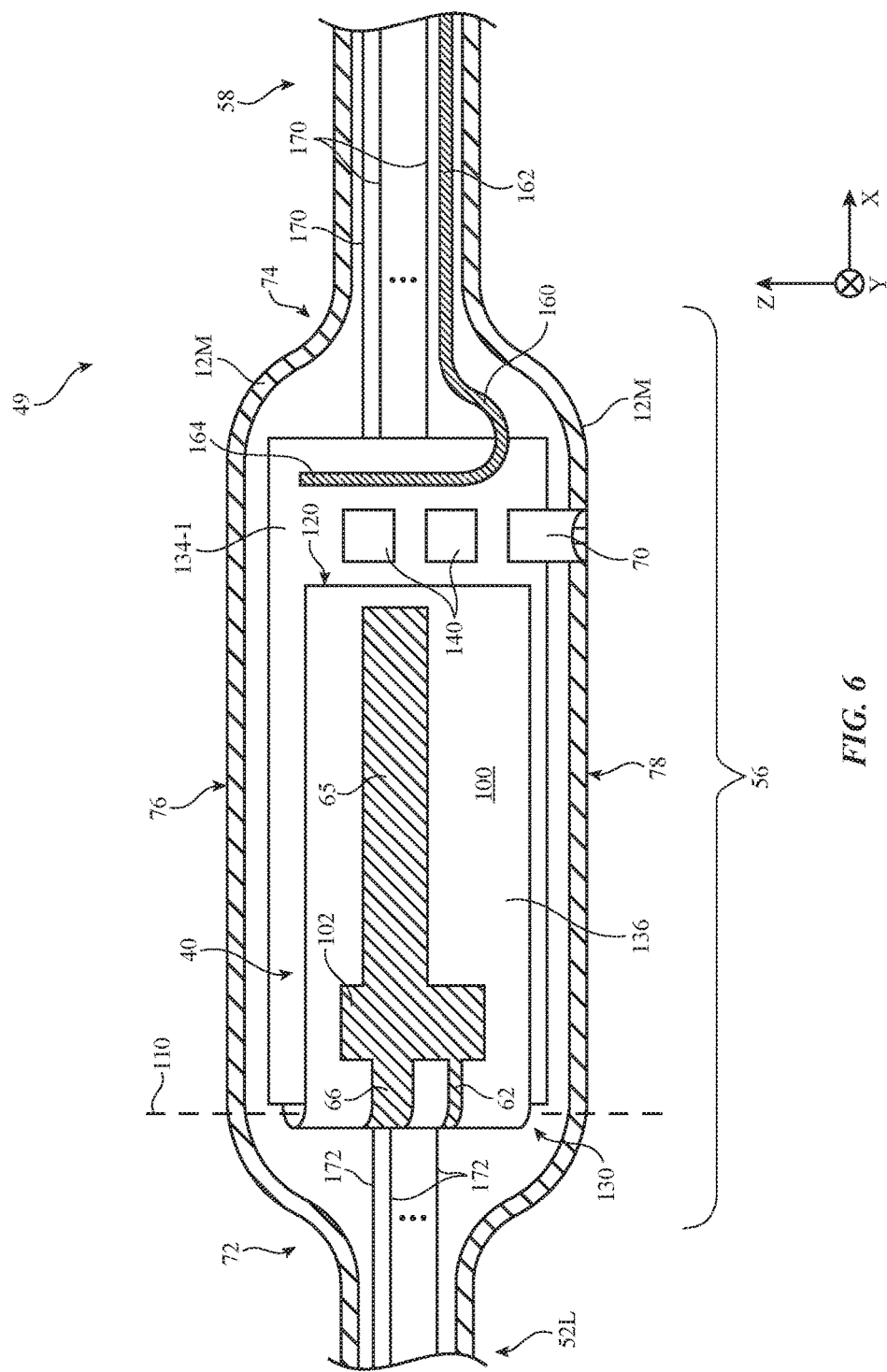
FIG. 6 is a top-down view showing how an illustrative antenna may be wrapped around a substrate for placement within an electronic device in accordance with an embodiment.

FIG. 6 is a top-down view of antenna 40 within portion 56 of device 10 (e.g., as viewed from side 64 of device 10). In particular, FIG. 6 shows a top-down view of main logic region 56 of device body 49, where the plane of the page is defined by the x-z axes of FIGS. 2 and 5 (e.g., a view as taken in the direction of arrow 64 of FIG. 5). In the diagram of FIG. 6, the portion of housing 12M covering side 64 of device body 49 is not shown for the sake of clarity.

As shown in FIG. 6, flexible tail 136 of flexible printed circuit 100 may be wrapped around axis 110 and over the top surface of rigid printed circuit layer 134-1. Conductive traces 22 forming shorting arm 66 and feed arm 62 may wrap around axis 110. Matching trace 102 may extend from arms 66 and 62 towards resonating element arm trace 65. Resonating element arm trace 65 may extend from matching trace 102 towards distal end 120.

When device 10 is being operated by a user, side 76 of device body 49 faces upwards (e.g., towards the head of the user) whereas side 78 of device body 49 faces downwards (e.g., towards the shoulders of the user). In this orientation, the user's body may have a greater electromagnetic influence on side 76 of device body 49 than side 78. This may be because the user's skin, which generally has a greater effect on the loading of antenna 40 than the user's clothing, may be closer to side 76 than side 78 during operation.

In practice, the presence of the user's body (skin) may have less effect on the antenna efficiency of antenna 40 when shorting arm 66 is closer to the user's body than feed arm 62 than when the user's body is closer to feed arm 62 than shorting arm 66. In the example of FIG. 6, shorting trace 66 of antenna 40 may be interposed between feed trace 62 and upper side 76 of housing 12M. In this way, shorting trace 66 is located closer to the user's body (skin) during operation than feeding trace 62. This may further minimize the impact of the presence of the user's body on the antenna efficiency of antenna 40, thereby maximizing or otherwise optimizing the efficiency and overall performance of antenna 40. Maintaining device 10 in the optimal orientation (e.g., with side 76 facing the head of the user, side 78 facing the torso of the user, side 62 facing the body of the user, and side 64 facing away from the user) may further ensure that shorting arm 66 is closer to the user's body than arm 62, thereby ensuring that the antenna continues to operate with optimal antenna efficiency.

If desired, bend retention structures such as structures 160 may be formed within device body 49. As an example, bend retention structures 160 are formed using a length of rigid wire or other metal structures. Rigid wire 160 may have a first portion 162 that extends along the length of band 58 (FIG. 2) to battery enclosure 54 in device body 49 and a second portion 164 that is embedded or otherwise attached to main logic board 130. Second portion 164 may be, for example, adhered to a surface of main logic board 130 or embedded (molded) within layer 134-1, 110, and/or 134-2 (FIG. 5). Second portion 164 may be oriented substantially perpendicular to first portion 162. When configured in this way, structure 162 may prevent twisting of band 58 (e.g., as shown by arrow 86 of FIG. 2), thereby ensuring that short arm 66 of antenna 40 remains oriented upwards (e.g., at a location that is closer to the user's skin than arm 62) during operation of device 10.

As shown in FIG. 6, connector structure 70 may be mounted to main logic board 130. Connector 70 may extend through housing 12M at bottom side 78. This may expose connector 70 so that a cable or other battery charging structure may be connected to main logic board 130 for charging battery 18.

Conductive paths such as conductive lines (wires) 170 may extend from side 74 of main logic board 130 through band 58. Conductive wires 170 may include conductive power lines for charging battery 18 in device portion 54 and for powering main logic board 130 using energy stored on battery 18. Conductive wires 170 may include audio lines for conveying right channel audio signals from main logic board 130 to right ear bud 50R. If desired, conductive wires 170 may include control lines or other paths for conveying control signals.

Conductive paths such as conductive wires 172 may extend from side 72 of main logic board 130 through path 52L. Conductive wires 172 may include power lines that convey power signals to communications box 66. Conductive wires 172 may include audio lines that convey left channel audio signals from main logic board 130 to left ear bud 50L. The audio lines in wires 172 may convey microphone signals from communications box 66 to main logic board 130. If desired, control signals may be conveyed over control lines in wires 172 (e.g., for controlling communications box 66 or for controlling components on main logic board 130).

Figure 7:
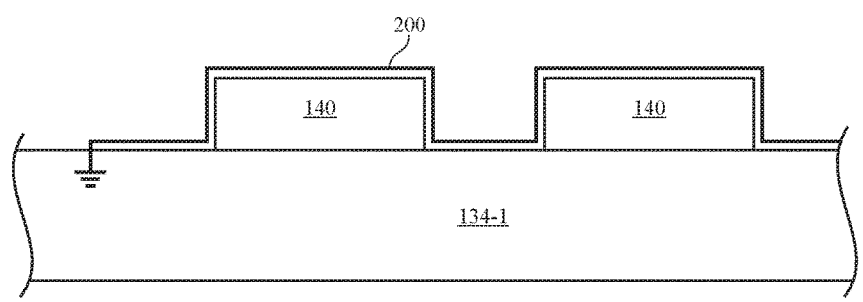
FIG. 7 is a diagram showing how a conductive conformal coating may be formed on a substrate and used as a portion of an antenna ground in accordance with an embodiment.

If desired, a conformal metal coating may be formed on main logic board 130 for further isolating antenna 40 from the body of a user. FIG. 7 is a diagram showing how a conformal metal coating may be formed on a surface of main logic board 130. As shown in FIG. 7, conformal coating 200 may be formed using metal or another conductor placed over the top surface of rigid printed circuit board layer 134-1. Coating 200 may be a layer of foil, stamped metal, or other conductive structures that conform to the shape of components 140. Coating 200 may serve as an electromagnetic shield that prevents the presence of the user's body adjacent to side 62 from affecting the antenna impedance of antenna 40.

The distance between antenna ground 60 (FIGS. 3 and 4) and antenna resonating element arm 65 may help to determine the bandwidth of antenna 40. In general, larger distances may provide more bandwidth than shorter distances. Coating 200 may conform to the shape of components 140 formed on the upper surface of layer 134-1. Coating 200 may be connected to ground at one or more locations. In this way, coating 200 may serve as a portion of antenna ground 60 (FIG. 4). By conforming to the shape of components 140 at rigid layer 134-1, the distance between grounded layer 200 and antenna resonating element arm 65 may be maximized, thereby maximizing the bandwidth of antenna 40. As an example, the portion of coating 200 formed over components 140 may be separated from antenna resonating element arm 65 by a vertical distance of 0.8 mm or more whereas the portion of coating 200 formed on the surface of layer 134-1 may be separated from antenna resonating element arm 65 by a vertical distance of less than or equal to approximately 1.8 mm. This example is merely illustrative. If desired, layer 200 may be omitted or formed elsewhere on main logic board 130.

FIG. 7 is a diagram showing how device 10 may be oriented with respect to the body of a user during normal operation. As shown in FIG. 7, main body 49 of device 10 is wrapped around the neck of a user such as user 210. For example, bend retention structures such as structures 160 (FIG. 6) within band 58 may maintain a bend for band 58 around the user's neck (e.g., around axis 88 as shown in FIG. 2). In an optimal orientation, side 76 of housing body 76 may face upwards towards the head of user 210 (e.g., side 76 is adjacent to the skin of the user's neck). Side 78 may face downwards towards the shoulders of user (e.g., side 78 is adjacent to the user's shirt or other clothing). Outer side 64 may face away from user 210 whereas inner side 62 faces towards the user's body in this configuration.

By wrapping antenna flexible printed circuit 100 around axis 110, antenna resonating element 65 points away from the user's body so that radio-frequency signals 36 are conveyed through outer side 64. Metal structures in main logic board 130 (e.g., conformal coating 200 of FIG. 7 or other structures) may serve as an electromagnetic shield between inner side 62 and antenna 40. Forming antenna short arm 66 closer to upper side 76 than feed arm 62 may minimize the effect of the skin of user 210 on the antenna efficiency of antenna 40. Structures such as bend retention structure 160, labels 82, visual element 68, and asymmetric earbud housings 12R and 12L may help to ensure that device 10 remains in this optimal orientation during use of device 10.

The example of FIG. 7 is merely illustrative. If desired, device 10 may be used in other orientations or configurations. For example, band 58 may wrap around the head of user 210 or may be located at any other desired location on user 210. Device 10 may be used in other scenarios that do not require the user to wear device 10 if desired (e.g., device 10 may be used while placed on a desktop or other surface, etc.).

The example of FIGS. 2-8 in which battery 18 is located at the end of main body 49 that is coupled to right earbud 50R and main logic board 130 is located at the end of main body 49 that is coupled to left earbud 50L is merely illustrative. If desired, battery 18 may be formed within band 58 or within control region 56. If desired, antenna 40 may be formed at any other desired location within device body 49 (e.g., within band 58, within portion 54, etc.). Main logic board 130 may be formed in portion 54 of body 49 (i.e., the side of body 49 coupled to right ear bud 50R) or along band 58 if desired. In the scenario where main logic board 130 is formed in region 54, battery 18 may be formed in region 56, in band 58, or may also be formed in region 54. In scenarios where main logic board 130 is formed in region 54, the structures shown in FIG. 6 may be reflected about the z-axis of FIG. 6, for example (e.g., so that antenna resonating element arm 65 faces outer side 64 and arm 66 is interposed between arm 62 and upper side 76).

Figure 8:
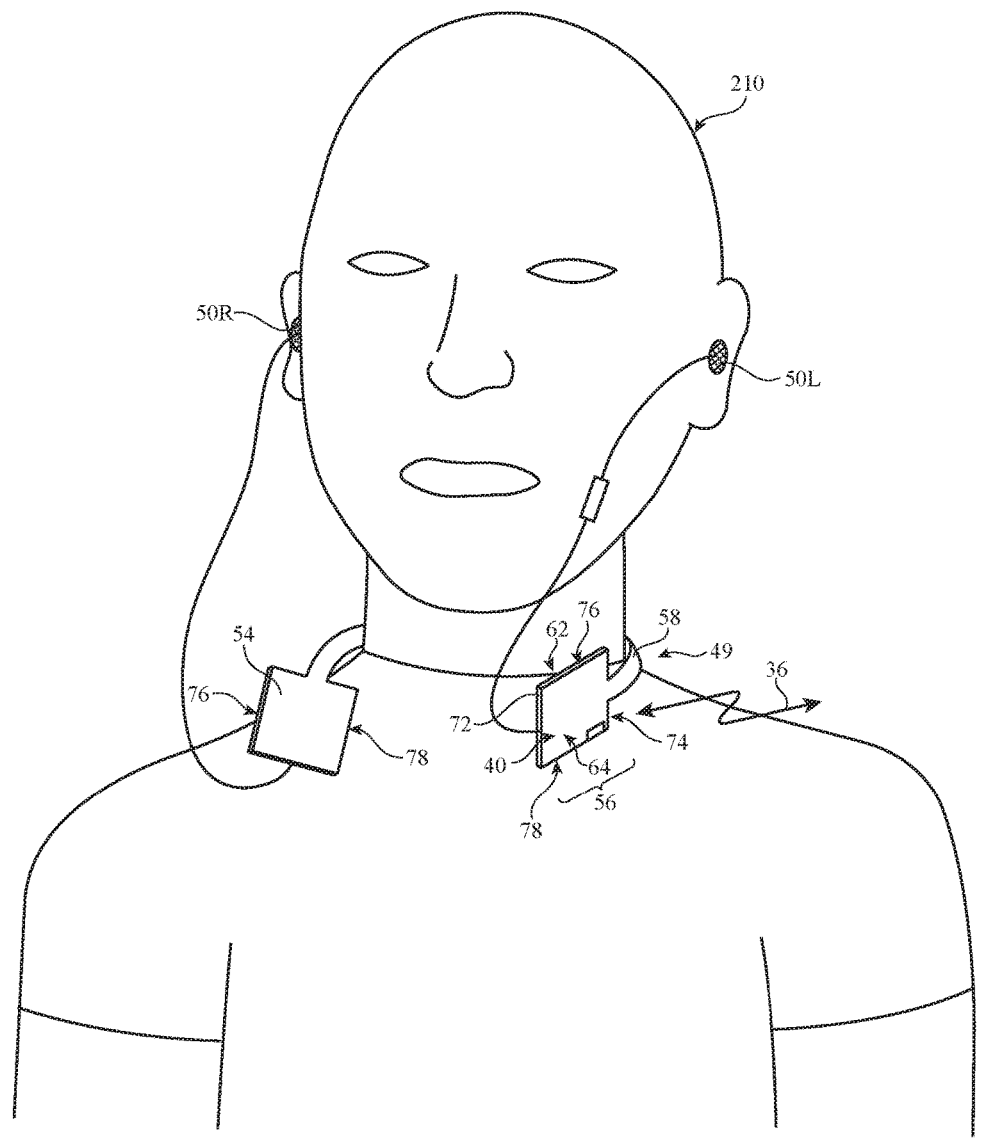
FIG. 8 is a diagram showing how an illustrative electronic device having an antenna of the type shown in FIGS. 3-7 may be oriented with respect to the body of a user during operation of the electronic device in accordance with an embodiment.
Figure 9:
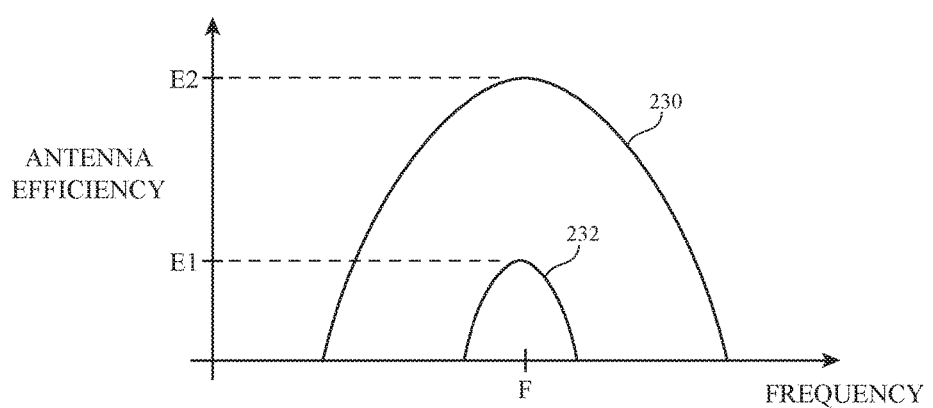
FIG. 9 is a graph of antenna performance (antenna efficiency) that shows how an illustrative antenna of the type shown in FIGS. 3-7 may exhibit optimal antenna efficiency when placed in proximity to the body of a user in accordance with an embodiment.

FIG. 9 is a graph showing how antenna efficiency varies as a function of frequency for different antenna configurations. Curve 232 illustrates the efficiency of an antenna when placed in the vicinity of the body of user 210 (e.g., in the absence of the features and arrangements described above in connection with FIGS. 1-8). The efficiency of the antenna in this configuration may peak at a level E1 at resonant frequency F (e.g., a Bluetooth® frequency at 2.4 GHz). This peak efficiency may be relatively low due to loading of the antenna by the user's skin, for example. Curve 230 illustrates the efficiency of antenna 40 in device 10 when device 10 is placed in the vicinity of the body of a user (e.g., when device 10 is placed on the user's body during operation such as is shown in FIG. 8). The efficiency of antenna 40 in this configuration may peak at a level E2 at frequency F, which is much greater than peak efficiency E1. Similarly, antenna 40 may exhibit greater efficiency bandwidth (e.g., corresponding to a horizontal width of curve 230) than an antenna associated with curve 232. In this way, the effect on the antenna efficiency of antenna 10 when in the vicinity of the user may be mitigated.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
a housing having opposing first and second housing walls;
a rigid flex printed circuit board mounted within the electronic device housing, wherein the rigid flex printed circuit board has a rigid printed circuit portion and a flexible printed circuit portion that extends from an end of the rigid printed circuit portion, the flexible printed circuit portion is folded over a surface of the rigid printed circuit portion and has a distal end that is interposed between the first housing wall and the surface of the rigid printed circuit portion, and the rigid printed circuit portion is interposed between the distal end of the flexible printed circuit portion and the second housing wall; and
a planar inverted-F antenna having an antenna resonating element and an antenna ground, wherein the antenna ground is formed on the rigid printed circuit portion and the antenna resonating element is formed from a conductive trace on the flexible printed circuit portion of the rigid flex printed circuit.

2. The electronic device defined in claim 1, wherein the rigid printed circuit portion of the rigid flex printed circuit board comprises a flexible printed circuit layer and a first rigid printed circuit layer attached to the flexible printed circuit layer.

3. The electronic device defined in claim 2, wherein the rigid printed circuit portion of the rigid flex printed circuit board further comprises a second rigid printed circuit layer attached to the flexible printed circuit layer, wherein the flexible printed circuit layer is interposed between the first and second rigid printed circuit layers.

4. The electronic device defined in claim 3, wherein the flexible printed circuit portion of the rigid flex printed circuit board comprises a portion of the flexible printed circuit layer that is free from the first and second rigid printed circuit layers.

5. The electronic device defined in claim 1, further comprising:
a dielectric support structure interposed between the distal end of the flexible printed circuit portion and the rigid printed circuit portion.

6. The electronic device defined in claim 5, further comprising:
a layer of adhesive that attaches the distal end of the flexible printed circuit portion to the dielectric support structure.

7. The electronic device defined in claim 5, further comprising:
an alignment post that attaches the dielectric support structure to the rigid printed circuit portion.

8. The electronic device defined in claim 1, further comprising:
an electronic component mounted to the surface of the rigid printed circuit portion; and
a conformal metal layer that is formed over the electronic component and the surface of the rigid printed circuit portion, wherein the conformal metal layer forms a portion of the antenna ground of the planar inverted-F antenna.

9. The electronic device defined in claim 1, wherein the planar inverted-F antenna further comprises a shorting trace that is formed on the flexible printed circuit portion and that couples the antenna resonating element arm to the antenna ground.

10. The electronic device defined in claim 9, wherein the planar inverted-F antenna further comprises a feed arm trace that is formed on the flexible printed circuit portion.

11. The electronic device defined in claim 9, further comprising:
an impedance matching trace formed on the flexible printed circuit portion between the antenna resonating element arm and the shorting trace, wherein the antenna resonating element arm has a first width and the impedance matching trace has a second width that is greater than the first width.

12. The electronic device defined in claim 1, wherein the rigid-flex printed circuit board is formed at a first end of the housing and the electronic device further comprises:
a battery formed at a second end of the housing that opposes the first end of the housing; and
control circuitry that is mounted to the rigid-flex printed circuit board and powered by the battery.

13. The electronic device defined in claim 12, further comprising a band structure that couples the first end of the housing to the second end of the housing.

14. The electronic device defined in claim 13, further comprising:
a first earbud coupled to the second end of the housing by a first conductive line; and
a second earbud coupled to the first end of the housing by a second conductive line, wherein the control circuitry provides audio signals to the first and second earbuds.

15. The electronic device defined in claim 14, wherein the control circuitry is configured to process stereo audio signals received by the planar inverted-F antenna from external equipment, the control circuitry is configured to convey signals from a right channel of the stereo audio signals to the first earbud, and the control circuitry is configured to convey signals from a left channel of the stereo audio signals to the second earbud.

16. The electronic device defined in claim 15, further comprising:
a microphone interposed on the second conductive line, wherein the control circuitry is configured to receive audio signals from the microphone and to transmit the audio signals received from the microphone to the external equipment over the planar inverted-F antenna.

17. The electronic device defined in claim 16, wherein the first end of the housing forms a first side of the housing, the second end forms a second side of the housing, the first side, the second side, a third side, and a fourth side of the housing extend between the first and second housing walls, a graphic component is formed on the second housing wall, the planar inverted-F antenna further comprises a shorting arm trace on the flexible printed circuit portion that is coupled between the antenna resonating element arm and the antenna ground, a feed arm trace on the flexible printed circuit portion that is coupled to the antenna resonating element arm, a first antenna feed terminal coupled to the feed arm trace, and a second antenna feed terminal coupled to the antenna ground, and the shorting arm trace is interposed between the feed arm trace and the third side of the housing.

18. A wireless accessory that performs wireless communications with external equipment, the wireless accessory comprising:
a housing body;
a first earbud coupled to a first end of the housing body;

a second earbud coupled to a second end of the housing body;

a rigid flex printed circuit board mounted within the housing body;

a planar inverted-F antenna formed on the rigid flex printed circuit board;

radio-frequency transceiver circuitry mounted to the rigid flex printed circuit board, wherein the radio-frequency transceiver circuitry is configured to receive audio data from the external equipment over the planar inverted-F antenna; and control circuitry mounted to the rigid flex printed circuit board, wherein the control circuitry is configured to provide the audio data to the first and second earbuds.

19. The wireless accessory defined in claim 18, wherein the housing body has opposing first and second ends, further comprising:

a battery mounted within a first portion of the housing body located at the first end, wherein the rigid flex printed circuit board is mounted within a second portion of the housing body located at the second end.

20. The wireless accessory defined in claim 19, further comprising:

a semi-rigid band coupled between the first portion and the second portion of the housing body; and conductive lines in the semi-rigid band, wherein the conductive lines convey power signals between the control circuitry and the battery and the conductive lines convey the audio data from the control circuitry and the first earbud.

21. The wireless accessory defined in claim 20, wherein the semi-rigid band has a curved shape that accommodates a body of a user, the housing body has an inner face that is configured to face the body of the user during operation of the wireless accessory, and the housing body has an outer face that is configured to face away from the body of the user during operation of the wireless accessory.

22. The wireless accessory defined in claim 21, wherein the rigid flex printed circuit board comprises a flexible printed circuit having a first portion that is interposed between first and second rigid printed circuit layers and a second portion that extends from and end of the first and second rigid printed circuit layers.

23. The wireless accessory defined in claim 22, wherein the second portion of the flexible printed circuit is wrapped around the first rigid printed circuit layer and is interposed between the first rigid printed circuit layer and the outer face of the housing body, and the planar inverted-F antenna comprises a resonating element arm trace formed on the second portion of the flexible printed circuit.

24. The wireless accessory defined in claim 23, wherein the planar inverted-F antenna further comprises an antenna ground, a short circuit trace coupled between the resonating element arm trace and the antenna ground, a feed arm trace, a first antenna feed terminal coupled to the feed arm trace, a second antenna feed terminal coupled to the antenna ground, and the feed arm trace and the short circuit trace are formed on the second portion of the flexible printed circuit.

25. A wireless headset that is configured to wirelessly receive audio signals from an electronic device, the wireless headset comprising:

first and second rigid printed circuit layers;

a flexible printed circuit having a first portion that is interposed between the first and second rigid printed circuit layers and a second portion that extends from an end of the first and second rigid printed circuit layers, wherein the second portion of the flexible printed circuit is wrapped around the first rigid printed circuit layer; and a planar inverted-F antenna having a planar antenna resonating element trace, an antenna ground, a short circuit trace coupled between the antenna ground and the planar antenna resonating element trace, and an antenna feed trace coupled to the planar antenna resonating element trace, wherein the planar antenna resonating element trace, the short circuit trace, and the antenna feed trace are formed on the second portion of the flexible printed circuit.

26. The wireless headset defined in claim 25, further comprising:

radio-frequency transceiver circuitry mounted to a selected one of the first and second rigid printed circuit layers, wherein the radio-frequency circuitry is configured to receive the audio signals from the electronic device over the planar inverted-F antenna;

a first antenna feed terminal coupled to the antenna feed trace;

a second antenna feed terminal coupled to the antenna ground; and a radio-frequency transmission line that couples the radio-frequency transceiver circuitry to the first and second antenna feed terminals.

27. The wireless headset defined in claim 26, further comprising:

a first speaker;

a second speaker; and control circuitry, wherein the control circuitry is configured to convey the audio signals to the first and second speakers.

* * * * *